(12) United States Patent
Park

(10) Patent No.: US 10,176,856 B2
(45) Date of Patent: Jan. 8, 2019

(54) SEMICONDUCTOR MEMORY APPARATUS

(71) Applicant: SK hynix Inc., Icheon-si Gyeonggi-do (KR)

(72) Inventor: Kee Teok Park, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/679,931

(22) Filed: Aug. 17, 2017

(65) Prior Publication Data

US 2018/0053541 A1 Feb. 22, 2018

(30) Foreign Application Priority Data

Aug. 18, 2016 (KR) .................. 10-2016-0104674

(51) Int. Cl.
| | | |
|---|---|---|
| *G11C 8/00* | (2006.01) | |
| *G11C 8/10* | (2006.01) | |
| *G11C 8/08* | (2006.01) | |
| *G11C 16/08* | (2006.01) | |

(52) U.S. Cl.
CPC .................. *G11C 8/10* (2013.01); *G11C 8/08* (2013.01); *G11C 16/08* (2013.01)

(58) Field of Classification Search
CPC .. G11C 16/08; G11C 8/10; G11C 8/08; G11C 2029/1202; G11C 2029/1204; G11C 2029/2602; G11C 2211/5622; G11C 29/08; G11C 29/26; G11C 29/34; G11C 29/46; G11C 7/12
USPC .................. 365/230.06, 230.08, 201, 189.05
See application file for complete search history.

(56) References Cited

U.S. PATENT DOCUMENTS

| | | | | |
|---|---|---|---|---|
| 5,557,573 | A * | 9/1996 | McClure ................ | G01R 31/30 365/189.05 |
| 5,673,270 | A * | 9/1997 | Tsujimoto .............. | G11C 29/38 365/189.05 |
| 6,003,149 | A * | 12/1999 | Nevill ..................... | G11C 29/34 714/718 |
| 8,966,329 | B2 * | 2/2015 | Clark ...................... | G11C 29/28 714/721 |

FOREIGN PATENT DOCUMENTS

KR 101114695 B1 4/2012

* cited by examiner

*Primary Examiner* — Gene Auduong
(74) *Attorney, Agent, or Firm* — William Park & Associates Ltd.

(57) ABSTRACT

A semiconductor memory apparatus may be provided. The semiconductor memory apparatus may include a row decoder configured to generate one or more row decoding signals based on a plurality of row addresses. The semiconductor memory apparatus may include a column decoder configured to generate one or more column decoding signals based on a plurality of column addresses.

18 Claims, 7 Drawing Sheets

400-1

SEMICONDUCTOR MEMORY APPARATUS

CROSS-REFERENCES TO RELATED APPLICATION

The present application claims priority under 35 U.S.C. § 119(a) to Korean application number 10-2016-0104674, filed on Aug. 18, 2016, in the Korean Intellectual Property Office, which is incorporated herein by reference in its entirety.

BACKGROUND

1. Technical Field

Various embodiments may generally relate to a semiconductor integrated circuit, and, more particularly, to a semiconductor memory apparatus.

2. Related Art

A semiconductor memory apparatus stores data and outputs the stored data. The semiconductor memory apparatus stores data at positions that are designated by addresses and outputs the data stored at the positions that are designated by the addresses.

It is possible to test whether a semiconductor memory apparatus normally stores data, normally outputs stored data, or normally stores and outputs data.

SUMMARY

In an embodiment, a semiconductor memory apparatus may be provided. The semiconductor memory apparatus may include a row decoder configured to generate one or more row decoding signals based on a plurality of row addresses. The semiconductor memory apparatus may include a column decoder configured to generate one or more column decoding signals based on a plurality of column addresses.

DETAILED DESCRIPTION

Hereinafter, a semiconductor memory apparatus will be described below with reference to the accompanying drawings through various examples of embodiments.

For reference, an embodiment including additional components may be provided. Furthermore, an active high or active low configuration indicating an active state of a signal or circuit may be changed depending on embodiments. As such, the logic levels of the signals may be different from or the opposite of those described. For example, a signal described as having a logic "high" level may alternatively have a logic "low" level, and a signal described as having a logic "low" level may alternatively have a logic "high" level. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
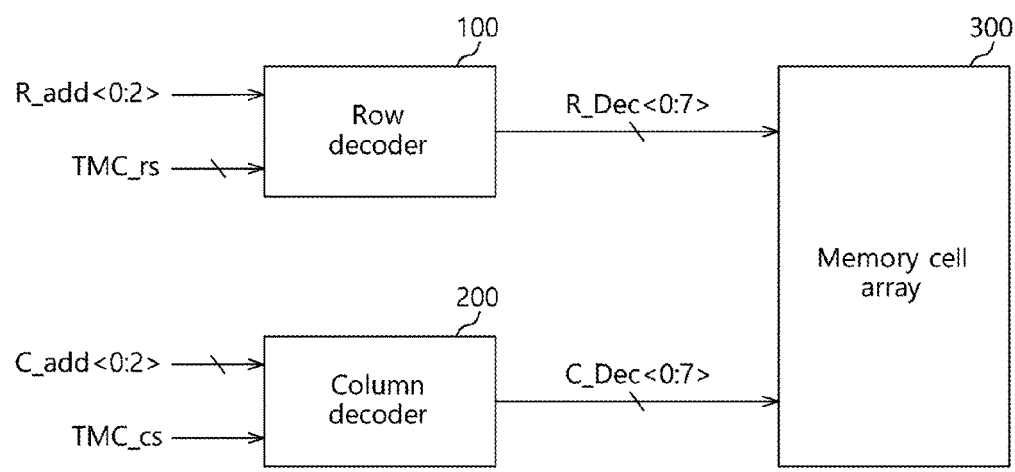
FIG. 1 is a configuration diagram illustrating a representation of an example of a semiconductor memory apparatus in accordance with an embodiment.

As illustrated in FIG. 1, a semiconductor memory apparatus in accordance with an embodiment may include a row decoder 100, a column decoder 200, and a memory cell array 300.

The row decoder 100 may generate a plurality of row decoding signals R_Dec<0:7> in response to a plurality of row addresses R_add<0:2> and a first test multi-cell signal TMC_rs. For example, the row decoder 100 may enable one row decoding signal R_Dec<i> (i is a natural number from 0 to 7) among first to eighth row decoding signals R_Dec<0:7> in response to first to third row addresses R_add<0:2> when the first test multi-cell signal TMC_rs is disabled. The row decoder 100 may enable simultaneously a plurality of row decoding signals R_Dec<i> and R_Dec<j> (j is a natural number from 0 to 7, different from i) among the first to eighth row decoding signals R_Dec<0:7> in response to the first to third row addresses R_add<0:2> when the first test multi-cell signal TMC_rs is enabled. The row decoder 100 in accordance with an embodiment may enable simultaneously two row decoding signals R_Dec<i> and R_Dec<j> among the first to eighth row decoding signals R_Dec<0:7> in response to the first to third row addresses R_add<0:2> when the first test multi-cell signal TMC_rs is enabled.

The column decoder 200 may generate a plurality of column decoding signals C_Dec<0:7> in response to a plurality of column addresses C_add<0:2> and a second test multi-cell signal TMC_cs. For example, the column decoder 200 may enable one column decoding signal C_Dec<k> (k is a natural number from 0 to 7) among first to eighth column decoding signals C_Dec<0:7> in response to first to third column addresses C_add<0:2> when the second test multi-cell signal TMC_cs is disabled. The column decoder 200 may enable simultaneously a plurality of column decoding signals C_Dec<k> and C_Dec<m> (m is a natural number from 0 to 7, different from k) among the first to eighth column decoding signals C_Dec<0:7> in response to the first to third column addresses C_add<0:2> when the second test multi-cell signal TMC_cs is enabled. The column decoder 200 in accordance with an embodiment may enable simultaneously two column decoding signals C_Dec<k> and C_Dec<m> among the first to eighth column decoding signals C_Dec<0:7> in response to the first to third column addresses C_add<0:2> when the second test multi-cell signal TMC_cs is enabled.

The memory cell array 300 may select at least one memory cell (see FIGS. 3 to 5) in response to the plurality of row decoding signals R_Dec<0:7> and the plurality of column decoding signals C_Dec<0:7>. For example, the memory cell array 300 may enable a plurality of word lines (see FIGS. 3 to 5) in response to the first to eighth row decoding signals R_Dec<0:7>, and enable a plurality of bit lines (see FIGS. 3 to 5) in response to the first to eighth column decoding signals C_Dec<0:7>. The memory cell array 300 may select a memory cell which is positioned at the intersection of an enabled word line (i.e., WL#) and an enabled bit line (i.e., BL#).

Figure 2:
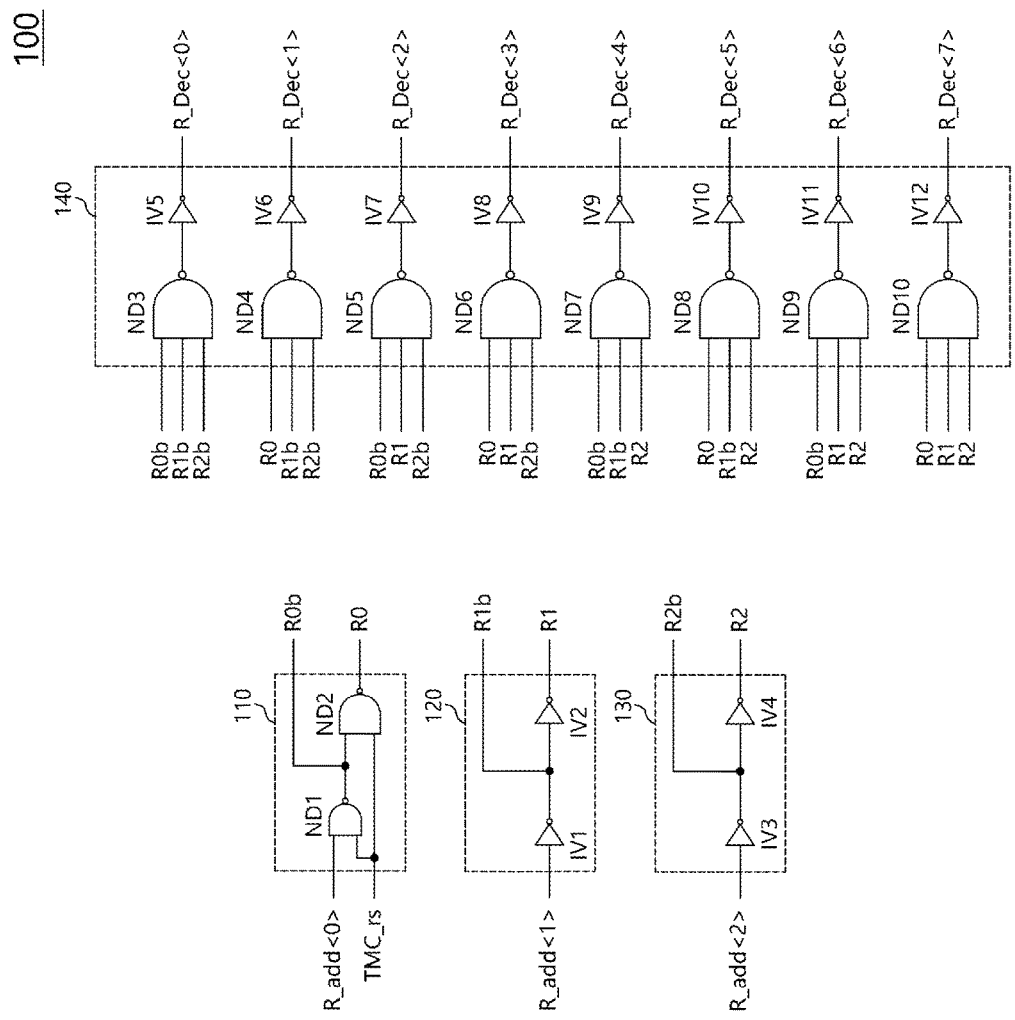
FIG. 2 is a configuration diagram illustrating a representation of an example of the row decoder illustrated in FIG. 1.

Referring to FIG. 2, the row decoder 100 may include a control signal distribution circuit 110, first and second signal distribution circuits 120 and 130, and a decoding signal generation circuit 140.

The control signal distribution circuit 110 may generate a first distribution signal R0 and a first distribution bar signal R0b in response to the first test multi-cell signal TMC_rs and the first row address R_add<0>. For example, the control signal distribution circuit 110 may generate the first distribution signal R0 and the first distribution bar signal R0b of different levels, in response to the first row address R_add<0>, when the first test multi-cell signal TMC_rs is disabled. The control signal distribution circuit 110 may generate the first distribution signal R0 and the first distribution bar signal R0b of the same level, regardless of the first row address R_add<0>, when the first test multi-cell signal TMC_rs is enabled. The control signal distribution circuit 110 may generate the first distribution signal R0 and the first distribution bar signal R0b as signals having a specified level, that is, a high level, regardless of the first row address R_add<0>, when the first test multi-cell signal TMC_rs is enabled.

The control signal distribution circuit 110 may include first and second NAND gates ND1 and ND2. The first NAND gate ND1 is inputted with the first row address R_add<0> and the first test multi-cell signal TMC_rs. The second NAND gate ND2 is inputted with the output signal of the first NAND gate ND1 and the first test multi-cell signal TMC_rs. The output signal of the first NAND gate ND1 is outputted as the first distribution bar signal R0b, and the output signal of the second NAND gate ND2 is outputted as the first distribution signal R0.

The first signal distribution circuit 120 may generate a second distribution signal R1 and a second distribution bar signal R1b in response to the second row address R_add<1>. For example, the first signal distribution circuit 120 may generate the second distribution signal R1 and the second distribution bar signal R1b of different levels in response to the second row address R_add<1>.

The first signal distribution circuit 120 may include first and second inverters IV1 and IV2. The first inverter IV1 is inputted with the second row address R_add<1>. The second inverter IV2 is inputted with the output signal of the first inverter IV1. The output signal of the first inverter IV1 is outputted as the second distribution bar signal R1b, and the output signal of the second inverter IV2 is outputted as the second distribution signal R1.

The second signal distribution circuit 130 may generate a third distribution signal R2 and a third distribution bar signal R2b in response to the third row address R_add<2>. For example, the second signal distribution circuit 130 may generate the third distribution signal R2 and the third distribution bar signal R2b of different levels in response to the third row address R_add<2>.

The second signal distribution circuit 130 may include third and fourth inverters IV3 and IV4. The third inverter IV3 is inputted with the third row address R_add<2>. The fourth inverter IV4 is inputted with the output signal of the third inverter IV3. The output signal of the third inverter IV3 is outputted as the third distribution bar signal R2b, and the output signal of the fourth inverter IV4 is outputted as the third distribution signal R2.

The decoding signal generation circuit 140 may generate the first to eighth row decoding signals R_Dec<0:7> in response to the first to third distribution signals R0, R1 and R2 and the first to third distribution bar signals R0b, R1b and R2b.

The decoding signal generation circuit 140 may include third to tenth NAND gates ND3, ND4, ND5, ND6, ND7, ND8, ND9 and ND10 and fifth to twelfth inverters IV5, IV6, IV7, IV8, IV9, IV10, IV11 and IV12. The third NAND gate ND3 is inputted with the first to third distribution bar signals R0b, R1b and R2b. The fifth inverter IV5 is inputted with the output signal of the third NAND gate ND3 and outputs the first row decoding signal R_Dec<0>. The fourth NAND gate ND4 is inputted with the first distribution signal R0, the second distribution bar signal R1b and the third distribution bar signal R2b. The sixth inverter IV6 is inputted with the output signal of the fourth NAND gate ND4 and outputs the second row decoding signal R_Dec<1>. The fifth NAND gate ND5 is inputted with the first distribution bar signal R0b, the second distribution signal R1 and the third distribution bar signal R2b. The seventh inverter IV7 is inputted with the output signal of the fifth NAND gate ND5 and outputs the third row decoding signal R_Dec<2>. The sixth NAND gate ND6 is inputted with the first distribution signal R0, the second distribution signal R1 and the third distribution bar signal R2b. The eighth inverter IV8 is inputted with the output signal of the sixth NAND gate ND6 and outputs the fourth row decoding signal R_Dec<3>. The seventh NAND gate ND7 is inputted with the first distribution bar signal R0b, the second distribution bar signal R1b and the third distribution signal R2. The ninth inverter IV9 is inputted with the output signal of the seventh NAND gate ND7 and outputs the fifth row decoding signal R_Dec<4>. The eighth NAND gate ND8 is inputted with the first distribution signal R0, the second distribution bar signal R1b and the third distribution signal R2. The tenth inverter IV10 is inputted with the output signal of the eighth NAND gate ND8 and outputs the sixth row decoding signal R_Dec<5>. The ninth NAND gate ND9 is inputted with the first distribution bar signal R0b, the second distribution signal R1 and the third distribution signal R2. The eleventh inverter IV11 is inputted with the output signal of the ninth NAND gate ND9 and outputs the seventh row decoding signal R_Dec<6>. The tenth NAND gate ND10 is inputted with the first distribution signal R0, the second distribution signal R1 and the third distribution signal R2. The twelfth inverter IV12 is inputted with the output signal of the tenth NAND gate ND10 and outputs the eighth row decoding signal R_Dec<7>.

When the first test multi-cell signal TMC_rs is disabled, the row decoder 100 configured as mentioned above generates the first to third distribution signals R0, R1 and R2 and the first to third distribution bar signals R0b, R1b and R2b which have levels different from the first to third distribution signals R0, R1 and R2, in response to the first to third row addresses R_add<0:2>, and enables one of the first to eighth row decoding signals R_Dec<0:7> in response to the first to third distribution signals R0, R1 and R2 and the first to third distribution bar signals R0b, R1b and R2b. When the first test multi-cell signal TMC_rs is enabled, the row decoder 100 fixes the first distribution signal R0 and the first distribution bar signal R0b to the same level, that is, the high level, regardless of the first row address R_add<0>, generates the second and third distribution signals R1 and R2 and the second and third distribution bar signals R1b and R2b which have levels different from the second and third distribution signals R1 and R2, in response to the second and third row addresses R_add<1:2>, and enables simultaneously two row decoding signals of the first to eighth row decoding signals R_Dec<0:7> in response to the first to third distribution signals R0, R1 and R2 and the first to third distribution bar signals R0b, R1b and R2b.

That is to say, for example, the row decoder 100 may enable one row decoding signal or two row decoding signals among the first to eighth row decoding signals R_Dec<0:7> in response to the first test multi-cell signal TMC_rs and the first to third row addresses R_add<0:2>.

The column decoder 200 may have the same configuration as the row decoder 100 except that the input and output (input/output) signals are different.

Similarly to the row decoder 100, the column decoder 200 may include a control signal distribution circuit 110, first and second signal distribution circuits 120 and 130, and a decoding signal generation circuit 140.

The control signal distribution circuit 110 included in the column decoder 200 is inputted with the first column address C_add<0> instead of the first row address R_add<0>, and is inputted with the second test multi-cell signal TMC_cs instead of the first test multi-cell signal TMC_rs.

The first and second signal distribution circuits 120 and 130 included in the column decoder 200 are inputted with the second and third column addresses C_add<1:2>, respectively.

The decoding signal generation circuit 140 included in the column decoder 200 outputs the first to eighth column decoding signals C_Dec<0:7> instead of the first to eighth row decoding signals R_Dec<0:7>.

The column decoder 200 configured in this way enables one column decoding signal among the first to eighth column decoding signals C_Dec<0:7> when the second test multi-cell signal TMC_cs is disabled, and enables simultaneously two column decoding signals among the first to eighth column decoding signals C_Dec<0:7> when the second test multi-cell signal TMC_cs is enabled.

The operation of the semiconductor memory apparatus in accordance with AN embodiment, configured as mentioned above, will be described below.

The operation in the case where both the first and second test multi-cell signals TMC_rs and TMC_cs are disabled will be described.

The row decoder 100 enables one among the first to eighth row decoding signals R_Dec<0:7> in response to the first to third row addresses R_add<0:2> when the first test multi-cell signal TMC_rs is disabled.

The column decoder 200 enables one among the first to eighth column decoding signals C_Dec<0:7> in response to the first to third column addresses C_add<0:2> when the second test multi-cell signal TMC_cs is disabled.

The memory cell array 300 enables one word line among the plurality of word lines when one row decoding signal is enabled among the first to eighth row decoding signals R_Dec<0:7>, and enables one bit line among the plurality of bit lines when one column decoding signal is enabled among the first to eighth column decoding signals C_Dec<0:7>. The memory cell array 300 selects one memory cell which is positioned at the intersection of the enabled one word line and the enabled one bit line.

The operation in the case where only the first test multi-cell signal TMC_rs is enabled between the first and second test multi-cell signals TMC_rs and TMC_cs will be described.

The row decoder 100 enables two row decoding signals among the first to eighth row decoding signals R_Dec<0:7> in response to the first to third row addresses R_add<0:2> when the first test multi-cell signal TMC_rs is enabled.

The column decoder 200 enables one among the first to eighth column decoding signals C_Dec<0:7> in response to the first to third column addresses C_add<0:2> when the second test multi-cell signal TMC_cs is disabled.

The memory cell array 300 enables two word lines among the plurality of word lines when two row decoding signals are enabled among the first to eighth row decoding signals R_Dec<0:7>, and enables one bit line among the plurality of bit lines when one column decoding signal is enabled among the first to eighth column decoding signals C_Dec<0:7>. The memory cell array 300 selects two memory cells which are positioned at the intersections of the enabled two word lines and the enabled one bit line.

Figure 3:
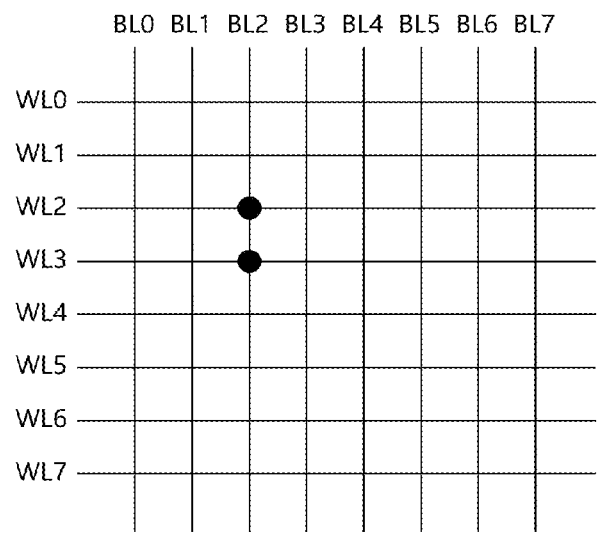
FIG. 3 is a representation of an example of a diagram to assist in the explanation of the operation of the memory cell array illustrated in FIG. 1.

This operation will be described below with reference to FIG. 3. The memory cell array 300 includes first to eighth word lines WL0, WL1, WL2, WL3, WL4, WL5, WL6 and WL7 which are enabled in response to the first to eighth row decoding signals R_Dec<0:7>, and includes first to eighth bit lines BL0, BL1, BL2, BL3, BL4, BL5, BL6 and BL7 which are enabled in response to the first to eighth column decoding signals C_Dec<0:7>.

The row decoder 100 enables two row decoding signals among the first to eighth row decoding signals R_Dec<0:7> in response to the first to third row addresses R_add<0:2> when the first test multi-cell signal TMC_rs is enabled. For example, the third and fourth word lines WL2 and WL3 may be enabled among the first to eighth word lines WL0 to WL7.

The column decoder 200 enables one among the first to eighth column decoding signals C_Dec<0:7> in response to the first to third column addresses C_add<0:2> when the second test multi-cell signal TMC_cs is disabled. For example, the third bit line BL2 may be enabled.

The memory cell array 300 selects two memory cells which are positioned at the intersections of the third and fourth word lines WL2 and WL3 and the third bit line BL2.

The operation in the case where only the second test multi-cell signal TMC_cs is enabled between the first and second test multi-cell signals TMC_rs and TMC_cs will be described.

The row decoder 100 enables one row decoding signal among the first to eighth row decoding signals R_Dec<0:7> in response to the first to third row addresses R_add<0:2> when the first test multi-cell signal TMC_rs is disabled.

The column decoder 200 enables two column decoding signals among the first to eighth column decoding signals C_Dec<0:7> in response to the first to third column addresses C_add<0:2> when the second test multi-cell signal TMC_cs is enabled.

The memory cell array 300 enables one word line among the plurality of word lines when one row decoding signal is enabled among the first to eighth row decoding signals R_Dec<0:7>, and enables two bit lines among the plurality of bit lines when two column decoding signals are enabled among the first to eighth column decoding signals C_Dec<0:

7>. The memory cell array 300 selects two memory cells which are positioned at the intersections of the enabled one word line and the enabled two bit lines.

Figure 4:
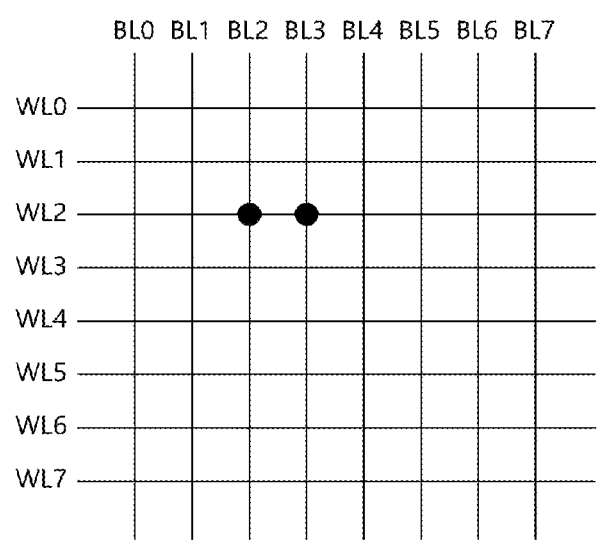
FIG. 4 is a representation of an example of a diagram to assist in the explanation of the operation of the memory cell array illustrated in FIG. 1.

This operation will be described below with reference to FIG. 4. The memory cell array 300 includes the first to eighth word lines WL0, WL1, WL2, WL3, WL4, WL5, WL6 and WL7 which are enabled in response to the first to eighth row decoding signals R_Dec<0:7>, and includes the first to eighth bit lines BL0, BL1, BL2, BL3, BL4, BL5, BL6 and BL7 which are enabled in response to the first to eighth column decoding signals C_Dec<0:7>.

The row decoder 100 enables one row decoding signal among the first to eighth row decoding signals R_Dec<0:7> in response to the first to third row addresses R_add<0:2> when the first test multi-cell signal TMC_rs is disabled. For example, the third word line WL2 may be enabled among the first to eighth word lines WL0 to WL7.

The column decoder 200 enables two column decoding signals among the first to eighth column decoding signals C_Dec<0:7> in response to the first to third column addresses C_add<0:2> when the second test multi-cell signal TMC_cs is enabled. For example, the third and fourth bit lines BL2 and BL3 may be enabled.

The memory cell array 300 selects two memory cells which are positioned at the intersections of the third word line WL2 and the third and fourth bit lines BL2 and BL3.

The operation in the case where both the first and second test multi-cell signals TMC_rs and TMC_cs are enabled will be described.

The row decoder 100 enables two row decoding signals among the first to eighth row decoding signals R_Dec<0:7> in response to the first to third row addresses R_add<0:2> when the first test multi-cell signal TMC_rs is enabled.

The column decoder 200 enables two column decoding signals among the first to eighth column decoding signals C_Dec<0:7> in response to the first to third column addresses C_add<0:2> when the second test multi-cell signal TMC_cs is enabled.

The memory cell array 300 enables two word lines among the plurality of word lines when two row decoding signals are enabled among the first to eighth row decoding signals R_Dec<0:7>, and enables two bit lines among the plurality of bit lines when two column decoding signals are enabled among the first to eighth column decoding signals C_Dec<0:7>. The memory cell array 300 selects four memory cells which are positioned at the intersections of the enabled two word lines and the enabled two bit lines.

Figure 5:
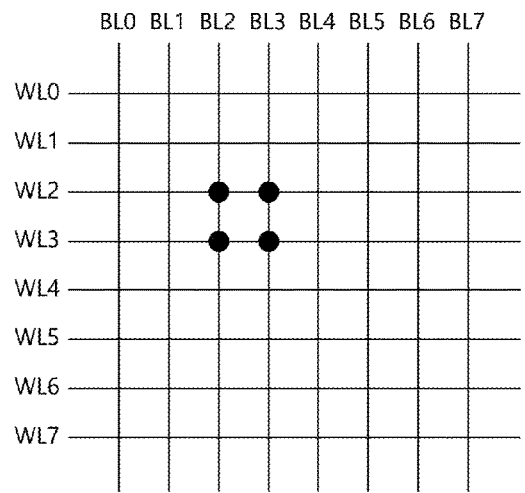
FIG. 5 is a representation of an example of a diagram to assist in the explanation of the operation of the memory cell array illustrated in FIG. 1.

This operation will be described below with reference to FIG. 5. The memory cell array 300 includes the first to eighth word lines WL0, WL1, WL2, WL3, WL4, WL5, WL6 and WL7 which are enabled in response to the first to eighth row decoding signals R_Dec<0:7>, and includes the first to eighth bit lines BL0, BL1, BL2, BL3, BL4, BL5, BL6 and BL7 which are enabled in response to the first to eighth column decoding signals C_Dec<0:7>.

The row decoder 100 enables two row decoding signals among the first to eighth row decoding signals R_Dec<0:7> in response to the first to third row addresses R_add<0:2> when the first test multi-cell signal TMC_rs is enabled. For example, the third and fourth word lines WL2 and WL3 may be enabled among the first to eighth word lines WL0 to WL7.

The column decoder 200 enables two column decoding signals among the first to eighth column decoding signals C_Dec<0:7> in response to the first to third column addresses C_add<0:2> when the second test multi-cell signal TMC_cs is enabled. For example, the third and fourth bit lines BL2 and BL3 may be enabled.

The memory cell array 300 selects four memory cells which are positioned at the intersections of the third and fourth word lines WL2 and WL3 and the third and fourth bit lines BL2 and BL3.

As is apparent from the above descriptions, the semiconductor memory apparatus in accordance with an embodiment may be configured to select one memory cell or a plurality of memory cells in response to a plurality of test multi-cell signals. While it is illustrated in FIGS. 1 to 5 that two word lines or two bit lines are enabled simultaneously, a person skilled in the art will appreciate that a configuration for enabling simultaneously four or more word lines or bit lines belongs to a technical modification that may be easily implemented.

Figure 6:
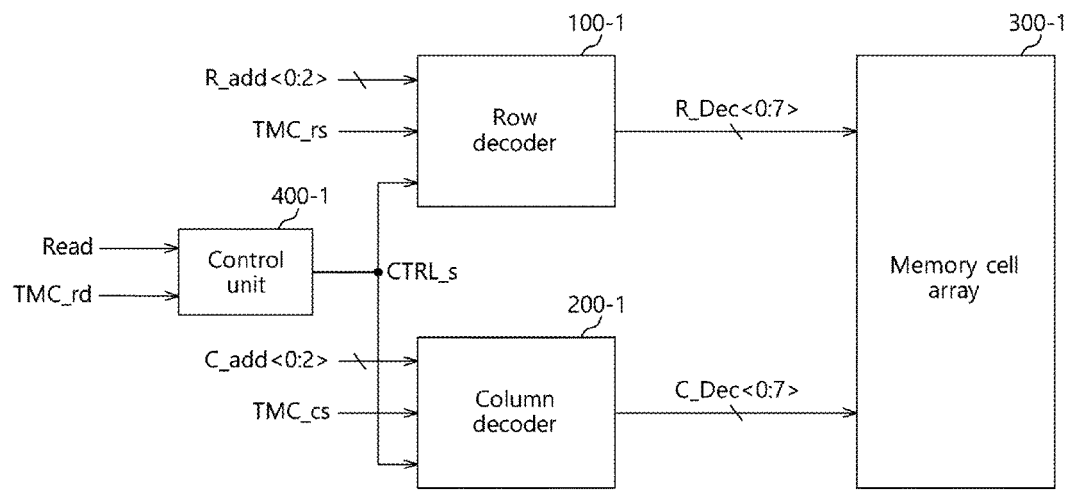
FIG. 6 is a configuration diagram illustrating a representation of an example of a semiconductor memory apparatus in accordance with an embodiment.

Referring to FIG. 6, a semiconductor memory apparatus in accordance with an embodiment may include a row decoder 100-1, a column decoder 200-1, a memory cell array 300-1, and a control unit 400-1.

The row decoder 100-1 may generate a plurality of row decoding signals R_Dec<0:7> in response to a plurality of row addresses R_add<0:2>, a first test multi-cell signal TMC_rs and a control signal CTRL_s. For example, the row decoder 100-1 may enable one row decoding signal among first to eighth row decoding signals R_Dec<0:7> in response to first to third row addresses R_add<0:2> when the first test multi-cell signal TMC_rs is disabled and the control signal CTRL_s is disabled. The row decoder 100-1 may enable simultaneously a plurality of row decoding signals among the first to eighth row decoding signals R_Dec<0:7> in response to the first to third row addresses R_add<0:2> when the first test multi-cell signal TMC_rs is enabled or the control signal CTRL_s is enabled. The row decoder 100-1 in accordance with an embodiment may enable simultaneously two row decoding signals among the first to eighth row decoding signals R_Dec<0:7> in response to the first to third row addresses R_add<0:2> when the first test multi-cell signal TMC_rs is enabled or the control signal CTRL_s is enabled.

The column decoder 200-1 may generate a plurality of column decoding signals C_Dec<0:7> in response to a plurality of column addresses C_add<0:2>, a second test multi-cell signal TMC_cs and the control signal CTRL_s. For example, the column decoder 200-1 may enable one column decoding signal among first to eighth column decoding signals C_Dec<0:7> in response to first to third column addresses C_add<0:2> when the second test multi-cell signal TMC_cs is disabled and the control signal CTRL_s is disabled. The column decoder 200-1 may enable simultaneously a plurality of column decoding signals among the first to eighth column decoding signals C_Dec<0:7> in response to the first to third column addresses C_add<0:2> when the second test multi-cell signal TMC_cs is enabled or the control signal CTRL_s is enabled. The column decoder 200-1 in accordance with an embodiment may enable simultaneously two column decoding signals among the first to eighth column decoding signals C_Dec<0:7> in response to the first to third column addresses C_add<0:2> when the second test multi-cell signal TMC_cs is enabled or the control signal CTRL_s is enabled.

The memory cell array 300-1 may select a plurality of memory cells (see FIGS. 3 to 5) in response to the plurality of row decoding signals R_Dec<0:7> and the plurality of column decoding signals C_Dec<0:7>. For example, the memory cell array 300-1 may enable a plurality of word lines (see FIGS. 3 to 5) in response to the first to eighth row decoding signals R_Dec<0:7>, and enable a plurality of bit lines (see FIGS. 3 to 5) in response to the first to eighth column decoding signals C_Dec<0:7>. The memory cell array 300-1 may select a memory cell which is positioned at the intersection of an enabled word line and an enabled bit line.

Figure 7:
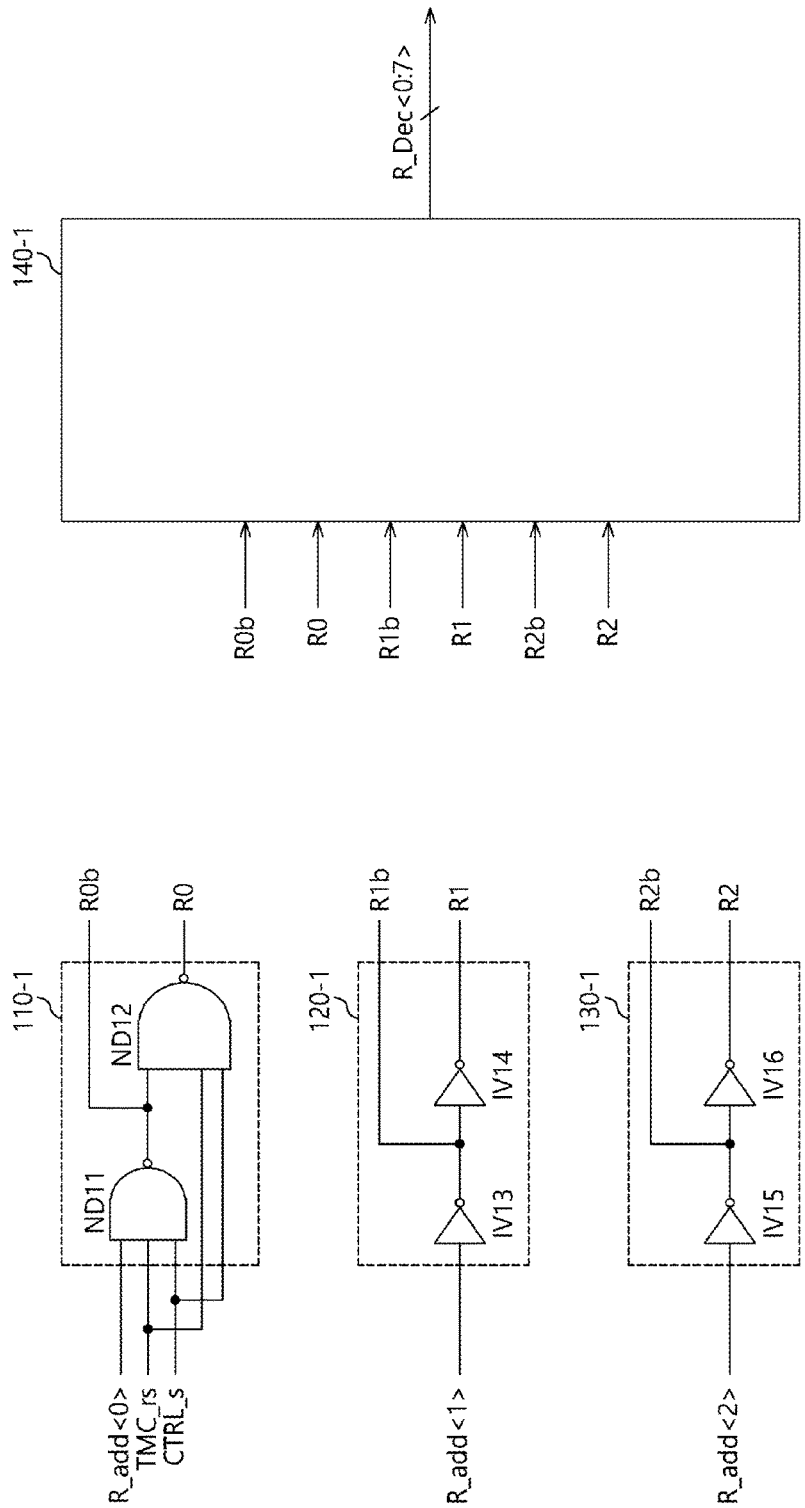
FIG. 7 is a configuration diagram illustrating a representation of an example of the row decoder illustrated in FIG. 6.

Referring to FIG. 7, the row decoder 100-1 may include a control signal distribution circuit 110-1, first and second signal distribution circuits 120-1 and 130-1, and a decoding signal generation circuit 140-1.

The control signal distribution circuit 110-1 may generate a first distribution signal R0 and a first distribution bar signal R0b in response to the first test multi-cell signal TMC_rs, the control signal CTRL_s and the first row address R_add<0>. For example, the control signal distribution circuit 110-1 may generate the first distribution signal R0 and the first distribution bar signal R0b of different levels, in response to the first row address R_add<0>, when the first test multi-cell signal TMC_rs is disabled and the control signal CTRL_s is disabled. The control signal distribution circuit 110-1 may generate the first distribution signal R0 and the first distribution bar signal R0b of the same level, regardless of the first row address R_add<0>, when the first test multi-cell signal TMC_rs is enabled or the control signal CTRL_s is enabled. The control signal distribution circuit 110-1 may generate the first distribution signal R0 and the first distribution bar signal R0b as signals having a specified level, that is, a high level, regardless of the first row address R_add<0>, when the first test multi-cell signal TMC_rs is enabled or the control signal CTRL_s is enabled.

The control signal distribution circuit 110-1 may include eleventh and twelfth NAND gates ND11 and ND12. The eleventh NAND gate ND11 is inputted with the first row address R_add<0>, the control signal CTRL_s and the first test multi-cell signal TMC_rs. The twelfth NAND gate ND12 is inputted with the output signal of the eleventh NAND gate ND11, the control signal CTRL_s and the first test multi-cell signal TMC_rs. The output signal of the eleventh NAND gate ND11 is outputted as the first distribution bar signal R0b, and the output signal of the twelfth NAND gate ND12 is outputted as the first distribution signal R0.

The first signal distribution circuit 120-1 may generate a second distribution signal R1 and a second distribution bar signal R1b in response to the second row address R_add<1>. For example, the first signal distribution circuit 120-1 may generate the second distribution signal R1 and the second distribution bar signal R1b of different levels in response to the second row address R_add<1>.

The first signal distribution circuit 120-1 may include thirteenth and fourteenth inverters IV13 and IV14. The thirteenth inverter IV13 is inputted with the second row address R_add<1>. The fourteenth inverter IV14 is inputted with the output signal of the thirteenth inverter IV13. The output signal of the thirteenth inverter IV13 is outputted as the second distribution bar signal R1b, and the output signal of the fourteenth inverter IV14 is outputted as the second distribution signal R1.

The second signal distribution circuit 130-1 may generate a third distribution signal R2 and a third distribution bar signal R2b in response to the third row address R_add<2>. For example, the second signal distribution circuit 130-1 may generate the third distribution signal R2 and the third distribution bar signal R2b of different levels in response to the third row address R_add<2>.

The second signal distribution circuit 130-1 may include fifteenth and sixteenth inverters IV15 and IV16. The fifteenth inverter IV15 is inputted with the third row address R_add<2>. The sixteenth inverter IV16 is inputted with the output signal of the fifteenth inverter IV15. The output signal of the fifteenth inverter IV15 is outputted as the third distribution bar signal R2b, and the output signal of the sixteenth inverter IV16 is outputted as the third distribution signal R2.

The decoding signal generation circuit 140-1 may generate the first to eighth row decoding signals R_Dec<0:7> in response to the first to third distribution signals R0, R1 and R2 and the first to third distribution bar signals R0b, R1b and R2b. The decoding signal generation circuit 140-1 may be configured in the same way as the decoding signal generation circuit 140 illustrated in FIG. 2.

The column decoder 200-1 may have the same configuration as the row decoder 100-1 except that the input and output (input/output) signals are different.

Similarly to the row decoder 100-1, the column decoder 200-1 may include a control signal distribution circuit 110-1, first and second signal distribution circuits 120-1 and 130-1, and a decoding signal generation circuit 140-1.

The control signal distribution circuit 110-1 included in the column decoder 200-1 is inputted with the first column address C_add<0> instead of the first row address R_add<0>, is inputted with the second test multi-cell signal TMC_cs instead of the first test multi-cell signal TMC_rs, and is inputted with the control signal CTRL_s.

The first and second signal distribution circuits 120-1 and 130-1 included in the column decoder 200-1 are inputted with the second and third column addresses C_add<1:2>, respectively.

The decoding signal generation circuit 140-1 included in the column decoder 200-1 outputs the first to eighth column decoding signals C_Dec<0:7> instead of the first to eighth row decoding signals R_Dec<0:7>.

The column decoder 200-1 configured in this way enables one column decoding signal among the first to eighth column decoding signals C_Dec<0:7> when the second test multi-cell signal TMC_cs is disabled, and enables simultaneously two column decoding signals among the first to eighth column decoding signals C_Dec<0:7> when the second test multi-cell signal TMC_cs is enabled or the control signal CTRL_s is enabled.

Referring to FIG. 6, the control unit 400-1 may generate the control signal CTRL_s in response to a test multi-cell read signal TMC_rd and a read signal Read. For example, the control unit 400-1 disables the control signal CTRL_s when the test multi-cell read signal TMC_rd or the read signal Read is disabled, and enables the control signal CTRL_s when the test multi-cell read signal TMC_rd and the read signal Read are enabled.

Figure 8:
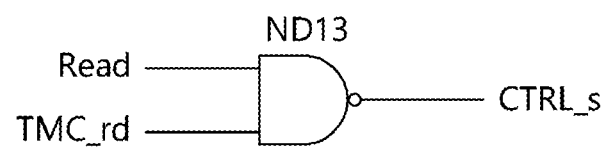
FIG. 8 is a configuration diagram illustrating a representation of an example of the control unit illustrated in FIG. 6.

Referring to FIG. 8, the control unit 400-1 may include a thirteenth NAND gate ND13. The thirteenth NAND gate ND13 is inputted with the test multi-cell read signal TMC_rd and the read signal Read, and outputs the control signal CTRL_s.

The semiconductor memory apparatus in accordance with an embodiment, configured as mentioned above, may operate as follows.

The operation in the case where all of the first and second test multi-cell signals TMC_rs and TMC_cs and the test multi-cell read signal TMC_rd are disabled will be described. The control unit 400-1 disables the control signal CTRL_s when the test multi-cell read signal TMC_rd is disabled.

The row decoder 100-1 enables one among the first to eighth row decoding signals R_Dec<0:7> in response to the first to third row addresses R_add<0:2> when the first test multi-cell signal TMC_rs is disabled and the control signal CTRL_s is disabled.

The column decoder 200-1 enables one among the first to eighth column decoding signals C_Dec<0:7> in response to the first to third column addresses C_add<0:2> when the second test multi-cell signal TMC_cs is disabled and the control signal CTRL_s is disabled.

The memory cell array 300-1 enables one word line among the plurality of word lines when one row decoding signal is enabled among the first to eighth row decoding signals R_Dec<0:7>, and enables one bit line among the plurality of bit lines when one column decoding signal is enabled among the first to eighth column decoding signals C_Dec<0:7>. The memory cell array 300-1 selects one memory cell which is positioned at the intersection of the enabled one word line and the enabled one bit line.

The operation in the case where only the first test multi-cell signal TMC_rs is enabled among the first and second test multi-cell signals TMC_rs and TMC_cs and the control signal CTRL_s will be described. The control signal CTRL_s is a signal which is disabled in the case where the test multi-cell read signal TMC_rd is disabled.

The row decoder 100-1 enables two row decoding signals among the first to eighth row decoding signals R_Dec<0:7> in response to the first to third row addresses R_add<0:2> when the first test multi-cell signal TMC_rs is enabled.

The column decoder 200-1 enables one among the first to eighth column decoding signals C_Dec<0:7> in response to the first to third column addresses C_add<0:2> when the second test multi-cell signal TMC_cs is disabled.

The memory cell array 300-1 enables two word lines among the plurality of word lines when two row decoding signals are enabled among the first to eighth row decoding signals R_Dec<0:7>, and enables one bit line among the plurality of bit lines when one column decoding signal is enabled among the first to eighth column decoding signals C_Dec<0:7>. The memory cell array 300-1 selects two memory cells which are positioned at the intersections of the enabled two word lines and the enabled one bit line.

This operation will be described below with reference to FIG. 3. The memory cell array 300-1 includes first to eighth word lines WL0, WL1, WL2, WL3, WL4, WL5, WL6 and WL7 which are enabled in response to the first to eighth row decoding signals R_Dec<0:7>, and includes first to eighth bit lines BL0, BL1, BL2, BL3, BL4, BL5, BL6 and BL7 which are enabled in response to the first to eighth column decoding signals C_Dec<0:7>.

The row decoder 100-1 enables two row decoding signals among the first to eighth row decoding signals R_Dec<0:7> in response to the first to third row addresses R_add<0:2> when the first test multi-cell signal TMC_rs is enabled. For example, the third and fourth word lines WL2 and WL3 may be enabled among the first to eighth word lines WL0 to WL7.

The column decoder 200-1 enables one among the first to eighth column decoding signals C_Dec<0:7> in response to the first to third column addresses C_add<0:2> when the second test multi-cell signal TMC_cs is disabled. For example, the third bit line BL2 may be enabled.

The memory cell array 300-1 selects two memory cells which are positioned at the intersections of the third and fourth word lines WL2 and WL3 and the third bit line BL2.

The operation in the case where only the second test multi-cell signal TMC_cs is enabled among the first and second test multi-cell signals TMC_rs and TMC_cs and the control signal CTRL_s will be described.

The row decoder 100-1 enables one row decoding signal among the first to eighth row decoding signals R_Dec<0:7> in response to the first to third row addresses R_add<0:2> when the first test multi-cell signal TMC_rs is disabled.

The column decoder 200-1 enables two column decoding signals among the first to eighth column decoding signals C_Dec<0:7> in response to the first to third column addresses C_add<0:2> when the second test multi-cell signal TMC_cs is enabled.

The memory cell array 300-1 enables one word line among the plurality of word lines when one row decoding signal is enabled among the first to eighth row decoding signals R_Dec<0:7>, and enables two bit lines among the plurality of bit lines when two column decoding signals are enabled among the first to eighth column decoding signals C_Dec<0:7>. The memory cell array 300-1 selects two memory cells which are positioned at the intersections of the enabled one word line and the enabled two bit lines.

This operation will be described below with reference to FIG. 4. The memory cell array 300-1 includes the first to eighth word lines WL0, WL1, WL2, WL3, WL4, WL5, WL6 and WL7 which are enabled in response to the first to eighth row decoding signals R_Dec<0:7>, and includes the first to eighth bit lines BL0, BL1, BL2, BL3, BL4, BL5, BL6 and BL7 which are enabled in response to the first to eighth column decoding signals C_Dec<0:7>.

The row decoder 100-1 enables one row decoding signal among the first to eighth row decoding signals R_Dec<0:7> in response to the first to third row addresses R_add<0:2> when the first test multi-cell signal TMC_rs is disabled. For example, the third word line WL2 may be enabled among the first to eighth word lines WL0 to WL7.

The column decoder 200-1 enables two column decoding signals among the first to eighth column decoding signals C_Dec<0:7> in response to the first to third column addresses C_add<0:2> when the second test multi-cell signal TMC_cs is enabled. For example, the third and fourth bit lines BL2 and BL3 may be enabled.

The memory cell array 300-1 selects two memory cells which are positioned at the intersections of the third word line WL2 and the third and fourth bit lines BL2 and BL3.

The operation in the case where both the first and second test multi-cell signals TMC_rs and TMC_cs are enabled or the control signal CTRL_s is enabled will be described. The control unit 400-1 enables the control signal CTRL_s when both the test multi-cell read signal TMC_rd and the read signal Read are enabled.

The row decoder 100-1 enables two row decoding signals among the first to eighth row decoding signals R_Dec<0:7> in response to the first to third row addresses R_add<0:2> when the first test multi-cell signal TMC_rs is enabled or the control signal CTRL_s is enabled.

The column decoder 200-1 enables two column decoding signals among the first to eighth column decoding signals C_Dec<0:7> in response to the first to third column addresses C_add<0:2> when the second test multi-cell signal TMC_cs is enabled or the control signal CTRL_s is enabled.

The memory cell array 300-1 enables two word lines among the plurality of word lines when two row decoding signals are enabled among the first to eighth row decoding signals R_Dec<0:7>, and enables two bit lines among the plurality of bit lines when two column decoding signals are enabled among the first to eighth column decoding signals C_Dec<0:7>. The memory cell array 300-1 selects four memory cells which are positioned at the intersections of the enabled two word lines and the enabled two bit lines.

This operation will be described below with reference to FIG. 5. The memory cell array 300-1 includes the first to eighth word lines WL0, WL1, WL2, WL3, WL4, WL5, WL6 and WL7 which are enabled in response to the first to eighth row decoding signals R_Dec<0:7>, and includes the first to eighth bit lines BL0, BL1, BL2, BL3, BL4, BL5, BL6 and BL7 which are enabled in response to the first to eighth column decoding signals C_Dec<0:7>.

The row decoder 100-1 enables two row decoding signals among the first to eighth row decoding signals R_Dec<0:7> in response to the first to third row addresses R_add<0:2> when the first test multi-cell signal TMC_rs is enabled or the control signal CTRL_s is enabled. For example, the third and fourth word lines WL2 and WL3 may be enabled among the first to eighth word lines WL0 to WL7.

The column decoder 200-1 enables two column decoding signals among the first to eighth column decoding signals C_Dec<0:7> in response to the first to third column addresses C_add<0:2> when the second test multi-cell signal TMC_cs is enabled or the control signal CTRL_s is enabled. For example, the third and fourth bit lines BL2 and BL3 may be enabled.

The memory cell array 300-1 selects four memory cells which are positioned at the intersections of the third and fourth word lines WL2 and WL3 and the third and fourth bit lines BL2 and BL3.

As is apparent from the above descriptions, the semiconductor memory apparatus in accordance with an embodiment may be configured to select one memory cell or a plurality of memory cells regardless of a read operation or a write operation in response to the plurality of test multi-cell signals TMC_rs and TMC_cs. The semiconductor memory apparatus in accordance with an embodiment may be configured to select a plurality of memory cells each time the read signal Read is enabled if the test multi-cell read signal TMC_rd is enabled with the plurality of test multi-cell signals TMC_rs and TMC_cs disabled. For example, the semiconductor memory apparatus in accordance with an embodiment may be configured to select a plurality of memory cells in only a read operation when performing a test. While it is illustrated that the semiconductor memory apparatus in accordance with an embodiment enables simultaneously two word lines or two bit lines, a person skilled in the art will appreciate that a configuration for enabling simultaneously four or more word lines or bit lines belongs to a technology that may be easily implemented.

Figure 9:
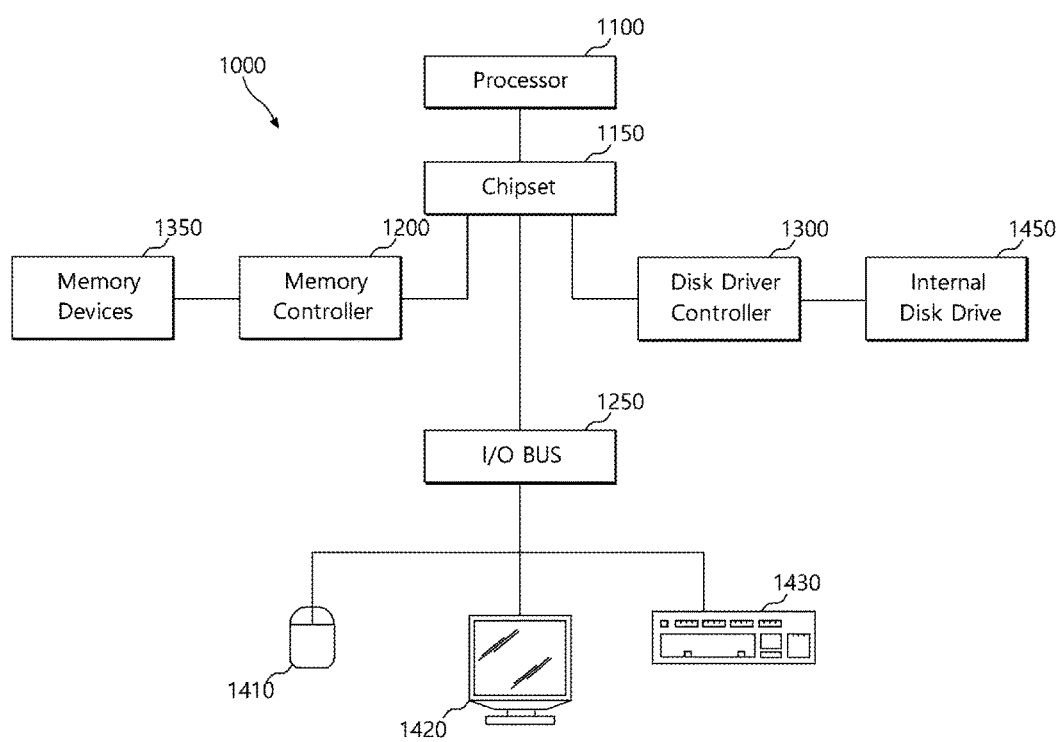
FIG. 9 illustrates a block diagram of an example of a representation of a system employing a semiconductor memory apparatus with the various embodiments discussed above with relation to FIGS. 1-8.

The semiconductor memory apparatuses as discussed above (see FIGS. 1-8) are particular useful in the design of other memory devices, processors, and computer systems. For example, referring to FIG. 9, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a semiconductor memory apparatus as discussed above with relation to FIGS. 1-8. In alternate embodiments, such as, for example but not limited to, cellular phones or digital cameras, the components may differ from the embodiments illustrated in FIG. 9.

While various embodiments have been described above, it will be understood to those skilled in the art that the embodiments described are examples only. Accordingly, the semiconductor memory apparatus described herein should not be limited based on the described embodiments.

What is claimed is:
1. A semiconductor memory apparatus comprising:
a row decoder configured to enable one among a plurality of row decoding signals or enable simultaneously at least two among the plurality of row decoding signals, based on a plurality of row addresses and a first test multi-cell signal;
a column decoder configured to enable one among a plurality of column decoding signals or enable simultaneously at least two among the plurality of column decoding signals, based on a plurality of column addresses and a second test multi-cell signal; and
a memory cell array including a plurality of word lines which are enabled based on the plurality of row decoding signals and a plurality of bit lines which are enabled based on the plurality of column decoding signals.

2. The semiconductor memory apparatus according to claim 1,
wherein the row decoder enables one among the plurality of row decoding signals in response to the plurality of row addresses based on the first test multi-cell signal being disabled, and
wherein the row decoder enables simultaneously at least two among the plurality of row decoding signals in response to the plurality of row addresses based on the first test multi-cell signal being enabled.

3. The semiconductor memory apparatus according to claim 2, wherein the row decoder comprises:
a control signal distribution circuit configured to generate a first distribution signal and a first distribution bar signal based on the first test multi-cell signal and a specified row address among the plurality of row addresses;
a signal distribution circuit configured to generate a second distribution signal and a second distribution bar signal based on a remaining row address excluding the specified row address among the plurality of row addresses; and
a decoding signal generation circuit configured to generate the plurality of row decoding signals based on the first distribution signal, the first distribution bar signal, the second distribution signal and the second distribution bar signal.

4. The semiconductor memory apparatus according to claim 3,
wherein the control signal distribution circuit generates the first distribution signal and the first distribution bar signal of different levels in response to the specified row address based on the first test multi-cell signal being disabled, and
wherein the control signal distribution circuit generates the first distribution signal and the first distribution bar signal of the same level regardless of the specified row address based on the first test multi-cell signal being enabled.

5. The semiconductor memory apparatus according to claim 3, wherein the signal distribution circuit generates the second distribution signal and the second distribution bar signal of different levels based on the remaining row address.

6. The semiconductor memory apparatus according to claim 1,
wherein the column decoder enables one among the plurality of column decoding signals in response to the plurality of column addresses based on the second test multi-cell signal being disabled, and
wherein the column decoder enables simultaneously at least two among the plurality of column decoding signals in response to the plurality of column addresses based on the second test multi-cell signal being enabled.

7. The semiconductor memory apparatus according to claim 6, wherein the column decoder comprises:
a control signal distribution circuit configured to generate a first distribution signal and a first distribution bar signal based on the second test multi-cell signal and a specified column address among the plurality of column addresses;
a signal distribution circuit configured to generate a second distribution signal and a second distribution bar signal based on a remaining column address excluding the specified column address among the plurality of column addresses; and
a decoding signal generation circuit configured to generate the plurality of column decoding signals based on the first distribution signal, the first distribution bar signal, the second distribution signal and the second distribution bar signal.

8. The semiconductor memory apparatus according to claim 7,
wherein the control signal distribution circuit generates the first distribution signal and the first distribution bar signal of different levels in response to the specified column address based on the second test multi-cell signal being disabled, and
wherein the control signal distribution circuit generates the first distribution signal and the first distribution bar signal of the same level regardless of the specified column address based on the second test multi-cell signal being enabled.

9. The semiconductor memory apparatus according to claim 7, wherein the signal distribution circuit generates the second distribution signal and the second distribution bar signal of different levels based on the remaining column address.

10. A semiconductor memory apparatus comprising:
a control unit configured to generate a control signal based on a test multi-cell read signal and a read signal;
a row decoder configured to enable one among a plurality of row decoding signals or enable simultaneously at least two among the plurality of row decoding signals, based on a plurality of row addresses, a first test multi-cell signal and the control signal;
a column decoder configured to enable one among a plurality of column decoding signals or enable simultaneously at least two among the plurality of column decoding signals, based on a plurality of column addresses, a second test multi-cell signal and the control signal; and
a memory cell array including a plurality of word lines which are selectively enabled based on the plurality of row decoding signals and a plurality of bit lines which are selectively enabled based on the plurality of column decoding signals.

11. The semiconductor memory apparatus according to claim 10,
wherein the control unit disables the control signal based on the test multi-cell read signal being disabled, and
wherein the control unit enables the control signal based on both the test multi-cell read signal and the read signal being enabled.

12. The semiconductor memory apparatus according to claim 10,
wherein the row decoder enables one among the plurality of row decoding signals in response to the plurality of row addresses based on both the control signal and the first test multi-cell signal being disabled, and wherein the row decoder enables simultaneously at least two among the plurality of row decoding signals in response to the plurality of row addresses when either one of the control signal or the first test multi-cell signal is enabled or when both the control signal and the first test multi-cell signal are enabled.

13. The semiconductor memory apparatus according to claim 12, wherein the row decoder comprises:
a control signal distribution circuit configured to generate a first distribution signal and a first distribution bar signal based on the first test multi-cell signal, the control signal and a specified row address among the plurality of row addresses;
a signal distribution circuit configured to generate a second distribution signal and a second distribution bar signal based on a remaining row address excluding the specified row address among the plurality of row addresses; and
a decoding signal generation circuit configured to generate the plurality of row decoding signals based on the first distribution signal, the first distribution bar signal, the second distribution signal and the second distribution bar signal.

14. The semiconductor memory apparatus according to claim 13,
wherein the control signal distribution circuit generates the first distribution signal and the first distribution bar signal of different levels based on both the first test multi-cell signal and the control signal being disabled, and
wherein the control signal distribution circuit generates the first distribution signal and the first distribution bar signal of the same level when either one of the first test multi-cell signal or the control signal is enabled or when both the first test multi-cell signal and the control signal are enabled.

15. The semiconductor memory apparatus according to claim 10,
wherein the column decoder enables one among the plurality of column decoding signals in response to the plurality of column addresses based on both the control signal and the second test multi-cell signal being disabled, and
wherein the column decoder enables simultaneously at least two among the plurality of column decoding signals in response to the plurality of column addresses when either one of the control signal or the second test multi-cell signal is enabled or when both the second test multi-cell signal and the control signal are enabled.

16. A semiconductor memory apparatus comprising:
a row decoder configured to enable simultaneously at least two among a plurality of row decoding signals based on a plurality of row addresses in a read operation and a write operation, or enable simultaneously at least two among the plurality of row decoding signals in response to the plurality of row addresses in only the read operation; and
a column decoder configured to enable simultaneously at least two among a plurality of column decoding signals based on a plurality of column addresses in the read operation and the write operation, or enable simultaneously at least two among the plurality of column decoding signals in response to the plurality of column addresses in only the read operation.

17. The semiconductor memory apparatus according to claim 16,
wherein the row decoder enables at least two among the plurality of row decoding signals in response to the plurality of row addresses regardless of the read operation and the write operation based on the first test multi-cell signal being enabled, and
wherein the row decoder enables simultaneously at least two among the plurality of row decoding signals in response to the plurality of row addresses in only the read operation based on both a test multi-cell read signal and a read signal being enabled with the first test multi-cell signal being disabled.

18. The semiconductor memory apparatus according to claim 16,
wherein the column decoder enables at least two among the plurality of column decoding signals in response to the plurality of column addresses regardless of the read operation and the write operation based on the second test multi-cell signal being enabled, and
wherein the column decoder enables simultaneously at least two among the plurality of column decoding signals in response to the plurality of column addresses in only the read operation based on both the test multi-cell read signal and the read signal being enabled with the second test multi-cell signal being disabled.

* * * * *